(12) United States Patent
Sekitani et al.

(10) Patent No.: US 10,176,903 B2
(45) Date of Patent: Jan. 8, 2019

(54) STRETCHABLE CONDUCTOR, METHOD FOR MANUFACTURING SAME, AND PASTE FOR FORMING STRETCHABLE CONDUCTOR

(71) Applicant: JAPAN SCIENCE AND TECHNOLOGY AGENCY, Kawaguchi-shi, Saitama (JP)

(72) Inventors: Tsuyoshi Sekitani, Osaka (JP); Takao Someya, Tokyo (JP); Naoji Matsuhisa, Tokyo (JP)

(73) Assignee: JAPAN SCIENCE AND TECHNOLOGY AGENCY, Kawaguchi-Shi (JP)

(*) Notice: Subject to any disclaimer, the term of this patent is extended or adjusted under 35 U.S.C. 154(b) by 112 days.

(21) Appl. No.: 15/115,974

(22) PCT Filed: Feb. 5, 2015

(86) PCT No.: PCT/JP2015/053298
§ 371 (c)(1),
(2) Date: Aug. 2, 2016

(87) PCT Pub. No.: WO2015/119217
PCT Pub. Date: Aug. 13, 2015

(65) Prior Publication Data
US 2017/0169914 A1    Jun. 15, 2017

(30) Foreign Application Priority Data
Feb. 5, 2014   (JP) .................................. 2014-020830

(51) Int. Cl.
*H01B 1/24*          (2006.01)
*H01B 1/22*          (2006.01)
(Continued)

(52) U.S. Cl.
CPC .................. *H01B 1/24* (2013.01); *C09D 5/24* (2013.01); *C09D 115/02* (2013.01); *H01B 1/22* (2013.01);
(Continued)

(58) Field of Classification Search
CPC .... C09D 115/02; C09D 5/24; H01B 13/0036; H01B 1/22; H01B 1/24; H01L 21/288;
(Continued)

(56) References Cited

U.S. PATENT DOCUMENTS

2005/0207096 A1    9/2005   Hinoki et al.
2008/0277631 A1    11/2008  Smela et al.
(Continued)

FOREIGN PATENT DOCUMENTS

CN    102047347 A    5/2011
CN    102498595 A    6/2012
(Continued)

OTHER PUBLICATIONS

Tsuyoshi Sekitani et al., "Stretchable active-matrix organic light-emitting diode display using printable elastic conductors", Nature Materials, vol. 8, No. 6, pp. 494-499, May 10, 2009.
(Continued)

*Primary Examiner* — Mark Kopec
*Assistant Examiner* — Jaison P Thomas

(57) ABSTRACT

A stretchable conductor of the present invention includes: a mixture which is configured of a stretchable portion made of an elastomer, and at least one type of conductive particles dispersed in the stretchable portion; and a conducting portion in which the conductive particles are aggregated in a higher concentration at one or a plurality of positions on an interface of the mixture than that at positions located in an inner portion of the mixture.

5 Claims, 10 Drawing Sheets

(51) Int. Cl.
*H01L 51/00* (2006.01)
*C09D 5/24* (2006.01)
*C09D 115/02* (2006.01)
*H01B 13/00* (2006.01)
*H01L 21/288* (2006.01)
*H01L 21/768* (2006.01)
*H01L 23/532* (2006.01)
*H01L 29/66* (2006.01)
*H01L 29/786* (2006.01)
*H01L 27/32* (2006.01)
*H01L 27/28* (2006.01)

(52) U.S. Cl.
CPC ....... *H01B 13/0036* (2013.01); *H01L 21/288* (2013.01); *H01L 21/76838* (2013.01); *H01L 23/5328* (2013.01); *H01L 27/3276* (2013.01); *H01L 29/66742* (2013.01); *H01L 29/78684* (2013.01); *H01L 51/0007* (2013.01); *H01L 51/0022* (2013.01); *H01L 51/0097* (2013.01); *H01L 27/283* (2013.01)

(58) Field of Classification Search
CPC ........... H01L 21/76838; H01L 23/5328; H01L 27/283; H01L 27/3276; H01L 29/66742; H01L 29/78684; H01L 51/0007; H01L 51/0022; H01L 51/0097
See application file for complete search history.

(56) References Cited

U.S. PATENT DOCUMENTS

2012/0177934 A1   7/2012  Vogel et al.
2018/0020936 A1*  1/2018  Kwon ................. A61B 5/0408

FOREIGN PATENT DOCUMENTS

| EP | 2 450 911 A1 | 5/2012 |
|---|---|---|
| JP | 2007-253629 A | 10/2007 |
| JP | 2010-153364 A | 7/2010 |
| JP | 2012-533857 A | 12/2012 |
| JP | 2014-236103 A | 12/2014 |
| WO | 98/40435 A1 | 9/1998 |
| WO | 2011/121017 A1 | 10/2011 |
| WO | 2011/145411 A1 | 11/2011 |

OTHER PUBLICATIONS

European Patent Office, "Extended European Search Report," issued in European Patent Application No. 15 745 944.7, which is a European counterpart of U.S. Appl. No. 15/115,974, dated Aug. 21, 2017, 10 pages.
State Intellectual Property Office of People's Republic of China, "First Office Action" and "Search Report", issued in CN Patent Application No. 201580006560.0, which is a Chinese counterpart of U.S. Appl. No. 15/115,974, dated Jan. 26, 2017, 12 pages (5 pages of English translation of First Office Action, 2 pages of English translation of Search Report, 3 pages of First Office Action, and 2 pages of Search Report).
International Search Report received for PCT Patent Application No. PCT/JP2015/053298 dated Apr. 28, 2015, 4 pages (2 pages of English translation of International Search Report, 2 pages of International Search Report).
Takao Someya et al., "Cut-and-Paste Organic FET Customized ICs for Application to Artificial Skin", Technical Report of IEICE ICD2004-29 (May 2004), published by the Institute of Electronics, Information and Communication Engineers, pp. 37-40.
Naoji Matsuhisa et al., "Fabrication and Evaluation of Elastic Conductor comprising of Silver Flakes and Fluorine Rubber", Dai 75 Kai The Japan Society of Applied Physics Shuki Gakujutsu Koenkai Koen Yokoshu, Sep. 1, 2014, 18p-A6-12.

* cited by examiner

STRETCHABLE CONDUCTOR, METHOD FOR MANUFACTURING SAME, AND PASTE FOR FORMING STRETCHABLE CONDUCTOR

TECHNICAL FIELD

The present invention relates to a stretchable conductor, a method for manufacturing the same, and a paste for forming a stretchable conductor.

Priority is claimed on Japanese Patent Application No. 2014-020830, filed Feb. 5, 2014, the content of which is incorporated herein by reference.

BACKGROUND ART

In recent years, a new technical field which is called flexible electronics has attracted much attention. This technology is for realizing mechanical flexibility in electronics, and is different from a technical trend of microfabrication in the related art. In particular, flexible electronics is considered as a technology having important value for large-volume electronics, such as a display, a solar battery, a sensor, or an actuator.

For example, as the size of an electronics device increases, flexibility becomes indispensable for portability or impact resistance. A difficulty after realizing flexible electronics lies in achieving having both electrical properties and mechanical properties which are excellent in a plastic film.

Stretchability of an electronics device is considered a function which is necessary for the electronics device to be integrated with a structure or a living body which is deformed according to movement or application of weight thereto. In order to realize a device having stretchability, it is necessary that an active circuit, such as a transistor which configures the device, and a passive circuit, such as a resistor or a capacitor, have a configuration in which damage is not received, and a configuration in which properties do not change according to deformation of the device.

However, a transistor made of an inorganic material typified by silicon, is made of a material which does not have stretchability, such as silicon or an inorganic oxide material, and cracks are generated in these materials under a strain which is much less than 1%. In addition, in an organic transistor using an organic semiconductor which has a carbon main skeleton, there are no cases where a breakage is generated even under a strain which is approximately 1% as the organic material is soft and has ductility, and in a case where the organic transistor is formed on a film-like substrate, the organic transistor is effective in realizing a highly flexible device under bending deformation.

In addition, in order to attach a film-like device such that the device adheres tightly to a surface of a three-dimensional object, it is necessary for the device to be not only flexible but also stretchable. In addition, for a device film for sticking a device on the surface of a robot or a human being, particularly on the surface of a joint portion, it is necessary for the film to be compatible with being extended by several tens of %.

Here, in the related art, a configuration in which a flexible sensor provided with a field effect type transistor integrated circuit can be attached to a part of a human body is provided, and research using the sensor as a pressure sensitive sensor has been carried out (refer to Non-Patent Document 1). In this research, a flexible circuit which can be folded using an organic field effect transistor (OFET) is realized, and an electronic artificial skin in which a pressure sensitive sensor array and a peripheral circuit which are effective as area sensors, such as tactile sensor, are integrated, has been made as a prototype.

Specifically, a pressure sensor is configured by forming a plurality of organic transistors on a film made of a flexible resin in a matrix form, and by layering a sheet of a pressure sensitive conductive rubber, a resin film having an electrode, and a film made of resin provided with through holes having lands at a predetermined pitch thereon.

CITATION LIST

Non-Patent Literature

[Non-Patent Document 1] Technical Report of IEICE ICD2004-29 (2004-5) (published by the Institute of Electronics, Information and Communication Engineers)

SUMMARY OF INVENTION

Technical Problem

Since an organic TFT described in Non-Patent Document 1 having elasticity can be bent to a radius of approximately 5 mm, the organic TFT can be wound around the surface of a human body or a robot. In addition, the drain current of the organic TFT decreases due to application of bending stress, but a pressure sensitive sensor which shows mechanical flexibility in which a degree of this decrease is 3% or less even when bent to a radius of approximately 5 mm, and further, sufficiently functions as a transistor even when bent to a radius of approximately 1 mm, is provided.

After realizing the above-described electronics device, it is necessary to connect an active circuit, such as a transistor which configures the device, a passive circuit, such as a resistor or a capacitor, or a sensor element which converts a physical quantity or the like into a signal, using a conductive wiring.

However, since the wiring made of metal in the related art breaks due to a strain which is less than 1%, by using a bent wiring, extension is realized by deformation of a shape similar to a spring. However, in such a solving method using a wiring pattern, it is necessary to provide a large limitation on the deformation of a base material, and there is a problem in that limits are placed on commercialization.

Meanwhile, since the wiring itself has stretchability in a stretchable conductive material in which conductive materials, such as carbon particles or carbon nanotubes, are dispersed in a rubber material, there is no restriction on the design, and the stretchable conductive material can be widely employed in the wiring of an electronics device.

However, there is a problem that an initial resistance value of a stretchable conductor of the type in the related art is high, and further, the resistance value becomes extremely high along with the extension which is several tens of %. This problem can be solved by increasing the amount of the dispersed conductive materials and by lowering the resistance value. However, in this case, there are problems that the wiring may become extremely weak, the wiring may break due to repeated extension and contraction, or the extension degree limit may become extremely low.

Considering the above-described situation, an object of the present invention is to provide a stretchable conductor having a high extension degree limit, a paste for forming a stretchable conductor, and a method for manufacturing a stretchable conductor, in which stretchability is excellent, in which deterioration of conductivity is low even in a case of extension, in which a problem that the conductor is weak, can be solved and in which there is less concern of breakage occurring even in a case of repeated extension and contraction.

Solution to Problem

In order to achieve the above-described object, the present invention employs the following configuration.

(1) A stretchable conductor of the present invention includes: a mixture which is configured of a stretchable portion made of an elastomer, and at least one type of conductive particles dispersed in the stretchable portion; and a conducting portion in which the conductive particles are aggregated in a higher concentration at one or a plurality of positions on an interface of the mixture than that at positions located in an inner portion of the mixture.

(2) In the stretchable conductor of the present invention, the amount of the conductive particles may be 400% or less with respect to the mass of the elastomer.

(3) In the stretchable conductor of the present invention, the stretchable conductor may be obtained by drying a mixed liquid configured of at least one first solvent which dissolves the elastomer, a second solvent of which 10% or more does not dissolve in the first solvent, and at least one type of the conductive particles.

(4) In the stretchable conductor of the present invention, the second solvent may be water or a solvent in which water is a main component, and may further include a surfactant which dissolves in the water.

(5) In the stretchable conductor of the present invention, the elastomer may be crosslinked.

(6) In the stretchable conductor of the present invention, the elastomer may be a fluororubber.

In the stretchable conductor of the present invention, the conductive particles can be fine scale-like particles made of a highly conductive metal material. In the stretchable conductor of the present invention, a high-concentration surfactant aqueous solution in which there is 30% by mass or more of the stretchable portion may be mixed in, in a proportion of 30% by mass or more with respect to the mass of the elastomer, and may be dried.

(7) A paste for forming a stretchable conductor of the present invention includes: at least one first solvent which dissolves an elastomer; an elastomer which dissolves in the first solvent; a second solvent of which 10% or more does not dissolve in the first solvent; and at least one type of conductive particles.

(8) In the paste for forming a stretchable conductor of the present invention, the amount of the conductive particles may be 400% by mass or less with respect to the elastomer.

(9) In the paste for forming a stretchable conductor of the present invention, the second solvent may be water or a solvent in which water is a main component, and may further include a surfactant which dissolves in the water.

(10) In the paste for forming a stretchable conductor of the present invention, the elastomer may be a fluororubber.

(11) A method for manufacturing a stretchable conductor of the present invention includes: performing printing in a shape of a conductor after dissolving an elastomer in a first solvent, and mixing a second solvent and conductive particles in each other, when manufacturing a stretchable conductor including a mixture which is configured of a stretchable portion made of an elastomer, and at least one type of the conductive particles dispersed in the stretchable portion, and a conducting portion in which the conductive particles are aggregated in a higher concentration on one or a plurality of interfaces formed in the mixture than that at positions located in an inner portion of the mixture.

(12) In the method for manufacturing a stretchable conductor of the present invention, the conducting portion may be generated by phase-separating the first solvent and the second solvent, and by drying the solvents.

(13) In the method for manufacturing a stretchable conductor of the present invention, a content of the conductive particles may be 400% by mass or less with respect to the elastomer.

(14) In the method for manufacturing a stretchable conductor of the present invention, a fluororubber may be used as the elastomer.

(15) In the method for manufacturing a stretchable conductor of the present invention, the second solvent can be water or a solvent in which water is a main component, and can further include a surfactant which dissolves in the water.

Advantageous Effects of Invention

According to the present invention, since the conducting portion in which the conductive particles are dispersed and the conductive particles are aggregated in a higher concentration at one or plural positions on the interface of the mixture than that at positions located in an inner portion of the mixture, is provided, it is possible to provide a stretchable conductor which has stretchability and excellent conductivity. In addition, it is possible to provide a highly stretchable conductor in which deterioration of the conductivity along with extension is unlikely to occur.

Therefore, it is possible to provide a stretchable conductor which is appropriate for configuring a circuit of a stretchable device which is necessary for electronics integrated into a structure or a living body which is deformed according to movement or application of weight thereto.

In particular, it is possible to provide a highly stretchable conductor with excellent properties which exceed 100 siemens and which is not found in the related art, even in a case of extension in which a strain of approximately 200% acts by adjusting proportions of a mixture of fluororubber and a fluorinated surfactant aqueous solution which configures the stretchable conductor, and by optimizing a blending quantity of the conductive particles.

DESCRIPTION OF EMBODIMENTS

Hereinafter, a stretchable device provided with a stretchable conductor according to a first embodiment of the present invention will be described appropriately with reference to the drawings.

Figure 1:
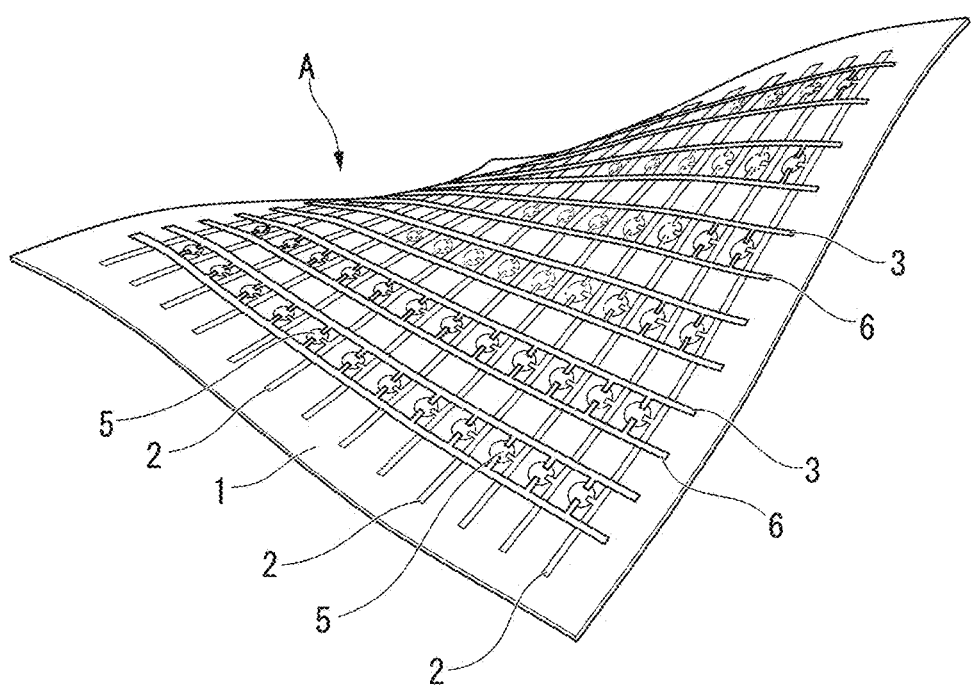
FIG. 1 is a perspective view showing a first embodiment of a stretchable device provided with a stretchable conductor according to the present invention.

Since FIG. 1 is a view showing a first embodiment of the stretchable device according to the embodiment, a stretchable device A of the first embodiment has a configuration in which a gate wiring 2, a source wiring 3, and a drain wiring 6, any of which is made of the stretchable conductor, are wired in a shape of a matrix on one surface side of a stretchable resin film 1, and a semiconductor loading base device 5 in which a semiconductor element (thin film transistor) 4 is embedded close to a part at which the wirings intersect with each other, and on an inner portion side of the stretchable resin film (stretchable base material) 1.

Figure 2:
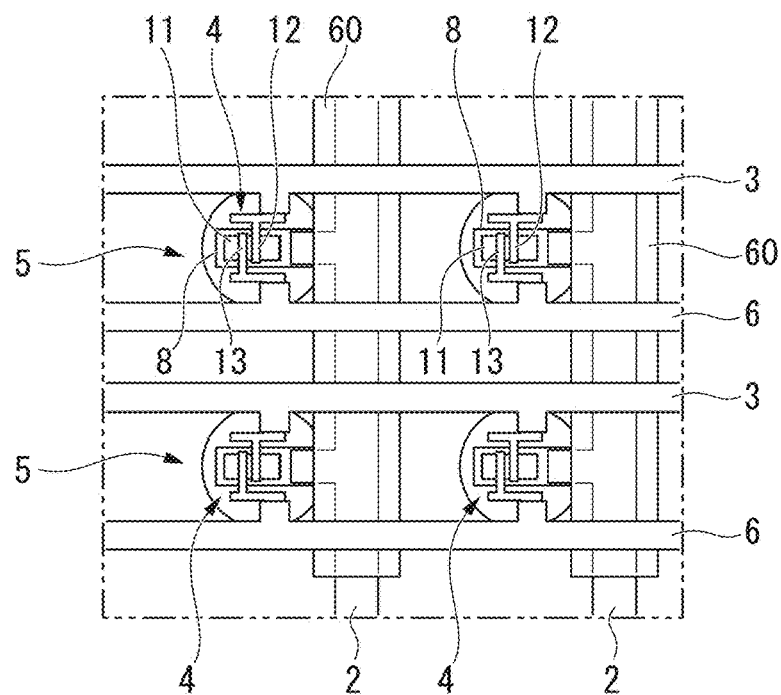
FIG. 2 is a plan view in which a main portion is enlarged showing a connection part between a semiconductor element and wirings made of the stretchable conductor which are provided in the above-described stretchable device.
Figure 3:
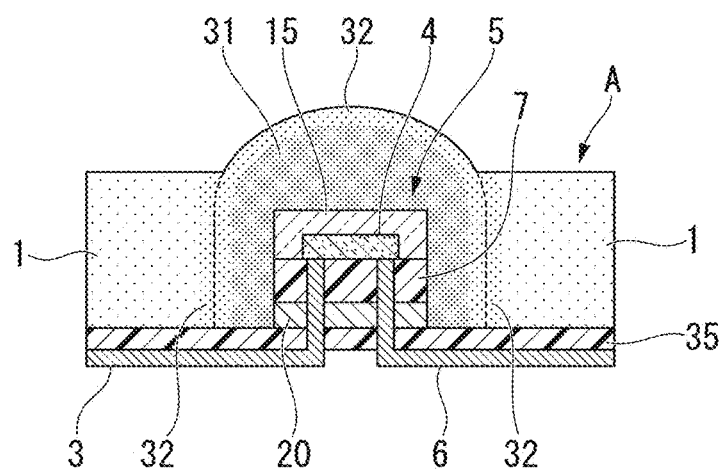
FIG. 3 is a side view in which the main portion is enlarged showing the connection part between the semiconductor element and wirings which are provided in the above-described stretchable device.
Figure 4:
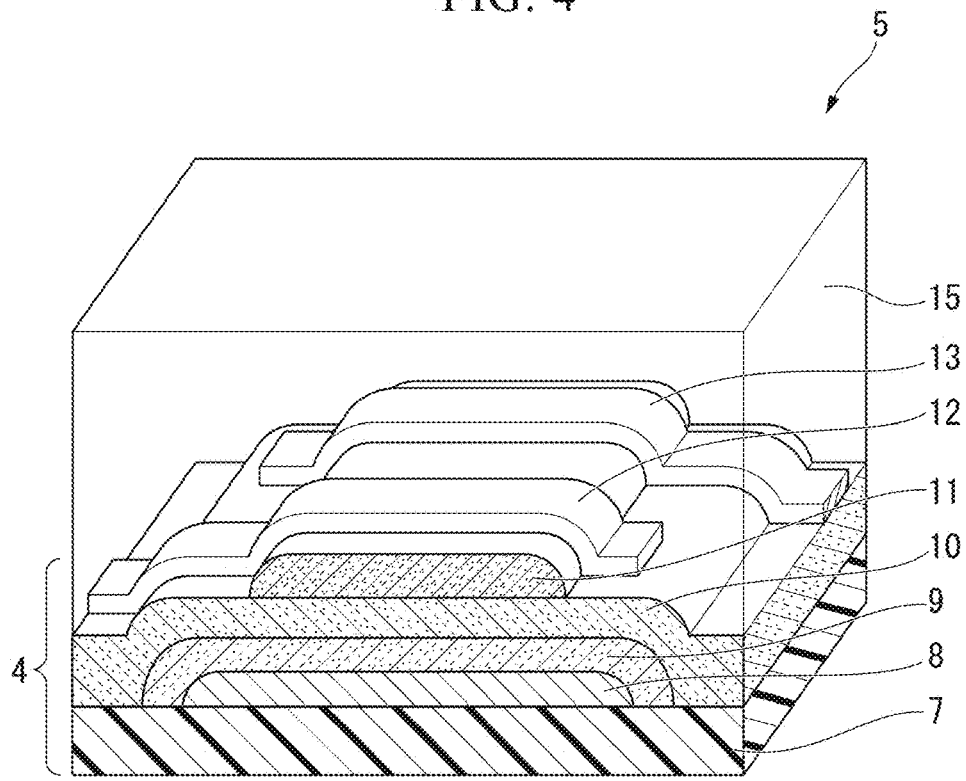
FIG. 4 is a sectional perspective view showing an example of a semiconductor element inner structure provided in the above-described stretchable device.
Figure 5:
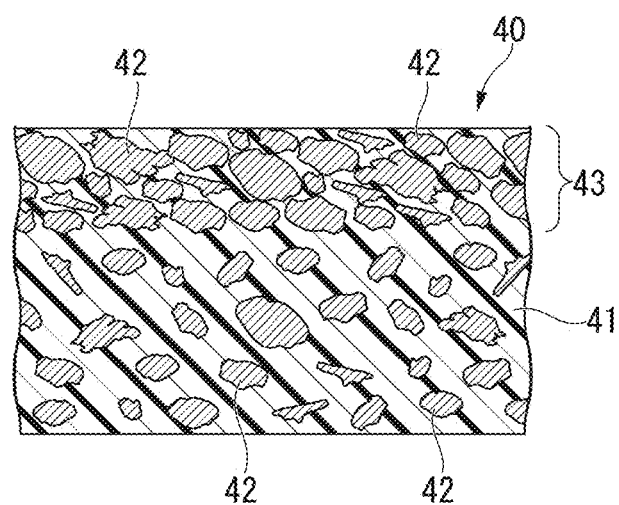
FIG. 5 is a partial sectional view of the wiring made of the stretchable conductor formed in the above-described stretchable device.

A connection structure of the thin film transistor 4 and each wiring is shown in FIG. 2, a sectional structure of a peripheral part of the thin film transistor 4 and the stretchable conductor is shown in FIG. 3, a specific structure of the semiconductor loading base device 5 is shown in FIG. 4, and a sectional structure of the wiring made of the stretchable conductor is shown in FIG. 5.

As shown in FIG. 4, the thin film transistor 4 in the example is a bottom-gate type thin film transistor in which a gate electrode 8 and an oxide film 9 which covers the gate electrode 8 are formed on an upper surface side (one surface side) of a resin substrate 7, a modifying film 10 is formed on the oxide film 9, an island-like organic semiconductor layer 11 is formed on the modifying film 10, and a source electrode 12 and a drain electrode 13 are formed to be separated from each other on both sides of the organic semiconductor layer 11 from a plan view.

Since deterioration of an electron movement degree due to the strain is less compared to that in Si-based semiconductor or the like, the organic semiconductor is appropriate for the stretchable device. In addition, since the organic semiconductor can be generated in a low temperature process, it is advantageous that a degree of freedom of selecting a substrate is high, creating can be performed on a thin resin substrate, and flexibility is easily ensured. Therefore, it is preferable to use the organic semiconductor for the stretchable device according to the embodiment.

In the thin film transistor 4 having the above-described structure, it is preferable that a resin substrate which has excellent chemical resistance properties and heat resistance properties and is made of polyimide or polyethylene naphthalate (PEN) is used as an example of the resin substrate 7, the gate electrode 8 can be configured of aluminum (Al) as an example, and the oxide film 9 can be configured of an aluminum oxide film. In a case where the resin substrate made of polyimide is used, a resin substrate having a thickness of 12.5 μm can be used as an example, in a case where the gate electrode made of Al is used, a gate electrode having a thickness of 100 nm can be used as an example, and in a case where the aluminum oxide film is used, an aluminum oxide film having a thickness of 19 nm can be used as an example.

A self-assembled monolayer (SAM) can be used as an example of the modifying film 10, and dinaphthothienothiophene (DNTT) can be used as an example of the organic semiconductor layer 11. The self-assembled monolayer is an organic molecule which forms a film of a self-organizing single molecule by soaking the substrate in a solution or the like, and is a film which is generally used in modifying the surface. Specifically, it is possible to use n-octadecyl phosphonic acid (C-18).

It is possible to provide an organic transistor which can configure a hybrid type gate insulation film by modifying the oxide film 9 made of aluminum using the modifying film 10 of the self-assembled monolayer, and can be driven at 3 V.

An inner sealing layer 15 made of an organic high molecular material, such as Parylene (name of a product made by Specialty Coating Systems, Inc. paraxylylene-based polymer) is formed on the resin substrate 7 to cover the thin film transistor 4 having the above-described structure, and the semiconductor loading base device 5 is configured. The semiconductor loading base device 5 having the above-described configuration is an example, and it is needless to say that an organic transistor which uses other substrates or wirings or a transistor having other structures can be employed in the stretchable device of the embodiment.

In the stretchable device A of the embodiment, the semiconductor loading base device 5 and the peripheral structure thereof are shown in FIG. 3, but the semiconductor loading base device 5 is embedded inside the stretchable resin film 1 made of an elastomer. A first sealing layer 31 made of an elastomer is formed to directly cover a circumferential surface and an upper portion side of the semiconductor loading base device 5 making a shape of a dome, and a second sealing layer 32 made of an elastomer is formed to cover the periphery of the first sealing layer 31 and overlap a part of the stretchable resin film 1. An inner coating layer 20 is formed on a rear surface side of the resin substrate 7 in the semiconductor loading base device 5, and a circumferential surface side of the inner coating layer 20 is also covered with the first sealing layer 31. In addition, an outer surface side of the inner coating layer 20 and an outer surface side of the stretchable resin film 1 are covered with a protective layer 35 made of an elastomer.

Gradation of a Young's modulus in which a Young's modulus gradually deteriorates is generated in a region separated from a region close to the first sealing layer 31 in the second sealing layer 32, and the gate wiring 2, the source wiring 3, and the drain wiring 6 which are connected to the semiconductor element 4 and made of the stretchable conductor, are formed on the rear surface side of the stretchable resin film 1. In the embodiment, the gate wiring 2, the source wiring 3, and the drain wiring 6 are provided as conductive circuits.

In the embodiment, the stretchable resin film 1, the first sealing layer 31, the second sealing layer 32, the inner coating layer 20, and the protective layer 35 are respectively made of elastomers of two types of liquid, such as polydimethylsiloxane (PDMS). The elastomer of two types of liquid used here is a material which can form the stretchable resin film by mixing a main agent and a crosslinking agent (hardener) at a predetermined proportion (mass proportion), by heating the mixture for a predetermined time period to an appropriate temperature, by causing a crosslinking reaction, and by hardening the mixture.

In the embodiment, as an example of the PDMS, it is possible to use Sylgard 184 (name of a product made by Dow Corning Toray Co., Ltd.) which is known as a type of highly transparent silicone. Here, the PDMS is obtained by crosslinking a mixture in which the main agent and the crosslinking agent are blended with each other in a proportion of 7:1 on the first sealing layer 31. Similarly, the PDMS is obtained by respectively crosslinking a mixture in which the main agent and the crosslinking agent are blended with each other in a proportion of 20:1 on the stretchable resin film 1 and the second sealing layer, a mixture in which the main agent and the crosslinking agent are blended with each other in a proportion of 10:1 on the inner coating layer 20, and a mixture in which the main agent and the crosslinking agent are mixed in each other in a proportion of 20:1 on the protective layer 35. In addition, since the above-described Sylgard 184 (name of a product made by Dow Corning Toray Co., Ltd.) has a standard blending proportion in a case where the proportion of the main agent and the crosslinking agent is 10:1, as a result of dispersing the crosslinking agent on the peripheral side from the first sealing layer 31 on which the crosslinking agent is excessive, the gradation of a crosslinking degree (that is, a Young's modulus) is generated on the second sealing layer 32.

In addition, as the elastomer of two types of liquid used in the embodiment, a polyester-based elastomer, a polyether-based elastomer, and a polyurethane-based elastomer, can be used.

In a case of the PDMS, in the first sealing layer 31, the Young's modulus becomes approximately several MPa, for example, approximately 1 MPa to 2 MPa, and in the second sealing layer 32 which is at a position separated from the first sealing layer 31, the Young's modulus becomes approximately several hundreds of kPa, for example, approximately 200 kPa to 300 kPa.

In addition, in the second sealing layer 32, in a region close to the first sealing layer 31, the Young's modulus becomes close to the Young's modulus of the first sealing layer 31 by the dispersion of the crosslinking agent, and the Young's modulus of an original blending proportion of the crosslinking agent included in the elastomer which configures the second sealing layer 32 is shown when being separated from the first sealing layer 31. In addition, the gradation of the Young's modulus is generated in both of the surface direction and the thickness direction of the second sealing layer 32. In other words, as it is possible to generate the gradation of the Young's modulus in both of the surface direction and the thickness direction of the stretchable resin film 1 in this manner, it is possible to more effectively suppress deterioration of transistor characteristics in a case where the strain is applied to the stretchable device A. In addition, a part which corresponds to the second sealing layer 32 of a region where the crosslinking agent is not dispersed, becomes the stretchable resin film 1.

Any of the gate wiring 2, the source wiring 3, and the drain wiring 6 which are employed in the structure of the embodiment, is formed of a stretchable conductor 40 which shows a sectional structure of FIG. 5.

The stretchable conductor 40 has a schematic structure including: a mixture which is configured of a stretchable portion 41 made of an elastomer, such as fluororubber including a surfactant, and a plurality of conductive particles 42 dispersed and blended in the stretchable portion 41; and a conducting portion 43 in which the conductive particles 42 are aggregated in a higher concentration on a front layer side of the stretchable portion 41 than that at positions located in an inner portion of the stretchable portion 41. The conducting portion 43 is present in a front layer portion which is an interface of the stretchable conductor 40, and has a structure which is partially close to a porous structure in which the conductive particles 42 are aggregated in a high concentration and the amount of an insulation material (stretchable portion 41 made of the elastomer) is small between the particles.

In addition, a structure in which the conducting portion 43 is provided on the front layer side is shown as an example, but the conducting portion 43 can employ a structure in which the conductive particles 42 are aggregated in a high concentration at other parts, such as the rear surface side of the stretchable conductor 40. For example, in a case where the stretchable conductor 40 is formed not on the film, such as the stretchable resin film 1, but on a surface of a suit of clothes or fabric, there is a case where the conducting portion 43 is configured along an interface with fibers or an interface with the air of the periphery. Therefore, the conducting portion 43 can appropriately employ a structure in which the conductive particles 42 are formed in a high concentration with respect to other parts at any position of the stretchable conductor 40. Since the conducting portion 43 is formed by using phase separation properties of a first solvent and a second solvent which will be described later, it is possible to adjust the aggregated state of the conductive particles 42 by adjusting the state of the phase separation.

In a case where the stretchable portion 41 is formed, in the embodiment, first, the fluororubber which is obtained in a shape of a mass and has already been crosslinked is finely divided in a shape of a pellet. This is for making the fluororubber easy to melt in a solvent in the next process.

Next, the amount of the pellet-like fluororubber and the conductive material is measured, the fluororubber is mixed into the first solvent, such as 4-methyl-2-pentanone which excellently dissolves the fluororubber, the fluororubber dissolves by stirring, and at the same time, the conductive material is homogenously dispersed in the solution. The first solvent which excellently dissolves rubber, such as the fluororubber, can use 2-heptanone or methyl ethyl ketone other than 4-methyl-2-pentanone used in the example.

In other words, it is possible to use 4-methyl-2-pentanone (methyl isobutyl ketone) as the first solvent, but when a solvent which can dissolve rubber, such as the fluororubber, is used, the present invention is not limited thereto. In addition, since it is necessary that solubility of the first solvent with respect to the second solvent is low, it is preferable to make a selection such that 10% or more of the second solvent does not dissolve in the first solvent.

More specifically, as binary fluororubber or ternary fluororubber, it is possible to use known fluororubber, such as G801, G901, G902, G912, and G952 (names of products made by Daikin Industries, Ltd.). These types of fluororubber are known as fluororubber by peroxide vulcanization.

In addition, in addition to the fluororubber, as rubber which can dissolve in the first solvent, it is possible to use rubber, such as urethane rubber or silicone rubber. In the stretchable portion 41, for example, the conductive material, such as carbon nanotubes may be additionally added.

It is preferable that the conductive particles 42 are made of scale-like fine particles made of highly conductive metal material, such as silver flakes, or conductive particles, such as carbon nanotubes or graphene. In addition, in addition to silver, the conductive particles 42 may be scale-like fine particles made of precious metal, such as gold or platinum, or scale-like highly conductive metal fine particles made of aluminum or copper. The shape of the particles is not limited to the shape of a scale, and may be any shape, such as a shape of a thin piece or a flat shape. In the front layer portion of the stretchable conductor 40, the scale-like conductive particles 42 are dispersed making a shape of a porous body to tightly overlap being arranged in the surface direction of the particles, and show excellent conductivity.

As the conductive particles 42, metal thin piece fine particles of which the particle diameter is 10 μm or less are preferable, and metal thin piece fine particles of which the particle diameter is approximately 1 μm to 5 μm are more preferable. It is preferable that the conductive particles 42 are added in an amount of 400% by mass or less with respect to the mass of the fluororubber which serves as the elastomer, and desirably in an amount of less than 400% by mass. When the addition amount is excessive, there is a concern that the stretchable conductor 40 becomes weak due to the extension and contraction.

The second solvent which is water, ethylene glycol, or a solvent which includes water as a main component, such as water which does not include ethylene glycol, is blended into the first solvent. In addition, in order to adjust the phase separation properties of the second solvent, a surfactant having necessary amount for making the phase separation properties excellent may be added to the second solvent.

Here, as an example of the fluorinated surfactant aqueous solution used here, it is possible to use a solution in which concentration of Zonyl FS300 (name of a product made by Du Pont Co., Ltd.) is 40% by mass. It is preferable to use high-concentration fluorinated surfactant aqueous solution in which the concentration is 30% by mass or more.

As an example of a proportion of a case where each component is mixed in, it is possible to mix the silver flakes, the fluororubber, the first solvent (organic solvent), and the second solvent (fluorinated surfactant aqueous solution of which the concentration is 40% by mass) at a mass proportion of 3:1:2:1.

As the second solvent, water, ethanol, or a solvent made by blending the surfactant into water or ethanol can be used.

As a mixing proportion of each component, a mixing proportion of the fluororubber and the second solvent (fluorinated surfactant aqueous solution) is most preferable when the equivalent amount or more of the second solvent (fluorinated surfactant aqueous solution) is added to the fluororubber as the mass proportion. It is possible to improve the extension properties of the stretchable conductor 40 by increasing the addition amount of the second solvent (fluorinated surfactant aqueous solution), but in order to ensure excellent conductivity even when the strain exceeds 50%, it is preferable to add 40% or more of the fluorinated surfactant, and it is more preferable to add 80% to 100% of the fluorinated surfactant with respect to the fluororubber in the mass proportion.

However, the surfactant is an effective additive for adjusting the mixed state of the first solvent which is for dissolving the rubber and the second solvent which is water or ethanol, and for generating a phase-separated state, but the first solvent and the second solvent may be mixed in without adding the surfactant.

Regarding the concentration of the fluorinated surfactant aqueous solution, it is preferable that the proportion of the water and the fluorinated surfactant aqueous solution is within a range of 5:2 to 3:2 in a case where the amount of water is constant.

The addition amount of the silver flakes can be a proportion of 3:1. In a case where the addition amount is excessive, a possibility that the stretchable conductor 40 is broken due to repeated extension is high, and in a case where the addition amount is small, there is a possibility that excellent conductivity is not obtained.

In addition, as the above-described mixture, by using a method of jet milling or the like with respect to carbon nanotubes, ionic liquid (EMITFSI: 1-ethyl-3-methylimidazolium (trifluoromethanesulfonyl)imide), and 4-methyl-2-pentanone, it is possible to use an ink mixture obtained by mixing and stirring for 12 hours, by adding the silver flakes and fluororubber into the obtained mixture, and by mixing and stirring approximately for 12 hours by a magnetic stirrer, thereby obtaining an ink-like mixture, and then, by drying the mixture for approximately 5 hours, and by volatilizing the solvent. In addition, carbon nanotubes may not be added in the above-described mixture.

By a printing method, such as an ink jet method, a dispenser, a screen printing, or a stencil printing, the ink-like or paste-like mixture described above is printed on the above-described stretchable resin film 1. Accordingly, it is possible to form the gate wiring 2, the source wiring 3, and the drain wiring 6 which are made of the stretchable conductor showing the sectional structure in FIG. 5.

In addition, it is possible to stabilize the fluororubber which serves as the elastomer by further performing the crosslinking with respect to the stretchable conductor formed by the above-described method.

In a case of the crosslinking, it is possible to perform the vulcanization by a method appropriate for the material, such as low-temperature vulcanization type polyol vulcanization or peroxide vulcanization which can vulcanize approximately at 120° C. In addition, it is possible to use a known technology, such as low-temperature vulcanization type (LTV) silicone rubber in a case of the silicone rubber, or ultraviolet curing type silicone rubber or ultraviolet curing type urethane rubber in a case where the material is weak to heat.

When the gate wiring 2, the source wiring 3, and the drain wiring 6 are made of the stretchable conductor 40 shown in FIG. 5, it is possible to obtain a wiring which can maintain excellent conductivity even when approximately several tens of % to 200% of extension is applied. For example, the wiring made of the stretchable conductor which can maintain the conductivity of 100 siemens even when approximately 200% of extension is applied, can provide a wiring which shows excellent stretchability and conductivity that are not obtained in the related art.

In addition, by performing the UV ozone processing with respect to the surface of the base body, such as the stretchable resin film 1, which forms the stretchable conductor, it is possible to improve the conductivity, and to suppress deterioration of the conductivity due to repeated extension.

As a main cause for being able to obtain the conductor which shows excellent stretchability as described above, the inventors of the present invention assume an action of a phenomenon which will be described in the following.

In the stretchable conductor 40 of the sectional structure shown in FIG. 5, the reason why the conducting portion 43 in which the conductive particles 42 of the silver flakes are aggregated in a high concentration in the front layer portion is generated, is considered as the fact that a micelle is generated by fluororubber and water and the front layer portion likely becomes partially porous during the drying since the fluorinated surfactant aqueous solution is mixed into the fluororubber. The surface of the stretchable conductor 40 becomes hydrophilic as the fluorinated surfactant is present together with water, and water and the conductive particles 42 are likely to be aggregated on the surface of the fluororubber. Therefore, it is considered that the phase separation occurs, the conductive particles 42 are likely to be aggregated on the outermost surface, an insulation material is unlikely to be generated between the conductive particles 42, the conductive particles 42 are aggregated in a high concentration on the font surface layer, and a partially porous structure in which the conductive particles 42, wherein the amount of the insulation material is small between the particles, are aggregated in a high concentration is obtained. The partially porous structure has high conductivity, maintains conduction between the conductive particles 42 even if the conductor is extended, and can limit deterioration of the conductivity. In addition, it is important that the second solvent of water is present and phase-separated with respect to the first solvent which dissolves rubber, and by including the surfactant here, it is possible to adjust the phase-separated state. It is considered that the surfactant is not a necessary component, and the presence of the first solvent and the second solvent which cause the phase separation is important.

In a case where water is not present, since the fluorinated surfactant is not used in forming a micelle, the fluorinated surfactant remains between the conductive particles 42 and is likely to become an insulation material, and the insulation material interrupts conductivity. In a case where the amount of the conductive particles 42 is excessive inside the stretchable conductor 40, bubbles are not generated during the stirring. In addition, since a large amount of water is included, it is considered that the state of phase separation varies depending on how the drying is performed and on the hydrophilicity, hydrophobicity of the stretchable resin film, and it is considered that the influence on conductivity is generated due to the state. In addition, it is possible to assume a structure in which the surfactant improves the quality of the surface of the silver flakes, in which the combining force of the interface of the silver flakes and the fluororubber becomes strong, and which is resistant to large extension.

In a case where the wiring is performed with respect to the thin film transistor 4 shown in FIGS. 2 and 3, a viahole is formed by laser light or the like to penetrate the resin substrate 7, the inner coating layer 20, and the protective layer 35 as shown in FIG. 3, the gate wiring 2 having a width of approximately 500 μm which is connected to the gate electrode 8 via the viahole is formed, an insulation film 60 which covers and hides a part of the gate wiring 2 is formed as shown in FIG. 2, and the source wiring 3 having a width of approximately 500 μm and the drain wiring 6 are formed by using the stretchable conductor to intersect the gate wiring 2.

By forming the wirings 2, 3, and 6 using the above-described method, it is possible to obtain the stretchable device A having a structure shown in FIGS. 1 to 3.

The stretchable device A manufactured as described above covers the periphery of the thin film transistor 4 by the first sealing layer 31 having a high Young's modulus, covers the outer side thereof by the second sealing layer 32 having a low Young's modulus, and is provided with the gate wiring 2, the source wiring 3, and the drain wiring 6 made of the stretchable conductor. Therefore, even in a case where the strain is applied by extending or bending the stretchable device A, it is possible to provide a structure in which deterioration of characteristics of the transistor of the semiconductor element 4 is unlikely to occur.

Since the gradation of the Young's modulus in which the Young' modulus gradually decreases is generated in a region separated from a region close to the first sealing layer 31 in the second sealing layer 32, it is possible to provide a structure in which deterioration of characteristics of the transistor of the semiconductor element 4 is limited in a case where the strain is applied.

Since the gradation of the Young's modulus is generated in the thickness direction thereof, that is, in the thickness direction of the stretchable resin film 1 in the second sealing layer 32, it is possible to obtain the stretchable device A in which the influence of the strain on the characteristic of the transistor is limited.

Furthermore, since the gate wiring 2, the source wiring 3, and the drain wiring 6 are formed of the stretchable conductor 40 in which the conductivity is unlikely to be deteriorated even when the extension of approximately 50% to 200% of strain is performed, the conductivity of the wirings 2, 3, and 6 does not deteriorate even when the stretchable device A is extended and contracted, and it is possible to stably operate each thin film transistor 4.

The stretchable device A has excellent characteristics, such as excellent stretchability similar to that of rubber, and being capable of realizing a stretchable electronic artificial skin which can be used being attached to a movable portion of a machine, such as a joint of a robot.

In the embodiment, employment of the stretchable conductor 40 which forms the gate wiring 2, the source wiring 3, and the drain wiring 6 to the stretchable device A shown in FIGS. 1 to 3 is one example, and it is needless to say that it is possible to widely employ the stretchable conductor 40 to other types of general stretchable device.

The stretchable device is not limited to an active matrix circuit as shown in FIGS. 1 and 2, and it is possible to widely employ a passive circuit which is realized by combining a resistor or a capacitor, or a circuit of a sensor element which converts a physical amount to a signal. Therefore, meanwhile, it is needless to say that it is possible to employ the stretchable conductor 40 thereto.

Even when the stretchable conductor 40 is employed for any use, the stretchability is excellent, it is unlikely to cause deterioration of the conductivity even in a case of being stretched and contracted, and it is possible to provide a circuit having excellent stretchability.

In addition, an example in which the stretchable resin film 1 is used as the stretchable base material is described in the embodiment described above, but it is possible to perform the wiring by using a knit-like flexible base material in which fibers have a knitting structure instead of the stretchable resin film 1, and by using the stretchable conductor which is described above on the outer surface or on the inside of the flexible base material.

In this manner, in a case where the stretchable conductor is employed in the flexible base material which has a knitting structure of the fibers, when the stretchable conductor including the surfactant is used, there is a concern that the surfactant is removed and the stretchable conductor is damaged in a case where the flexible base material is washed. Therefore, in a case where the stretchable conductor is employed in the flexible base material in which the fibers, such as a suit of clothes or shirts, have a knitting structure, it is preferable to configure the stretchable conductor by adding the first solvent without adding the surfactant to the second solvent.

In a case where the stretchable conductor is formed on the flexible base material in which the fibers have a knitting structure, it is possible to form a structure which is encroached and integrated with the flexible base material by coating the flexible base material in which the fibers have a knitting structure with an ink-like or paste-like mixture which is a mixture of the first solvent and the second solvent including the conductive particles, and drying the flexible base material. In this case, the conducting portion made of the conductive particles can have a structure in which the conductive particles are aggregated in a high concentration on the front surface of the flexible base material having a knitting structure. However, it is also possible to have a structure in which the conductive particles are aggregated in a high concentration on a rear surface side of the flexible base material having a knitting structure. In addition, it is possible to form the conducting portion on the interface between the fibers having a knitting structure and a dried body of the mixture which surrounds the fibers.

From the above, in the stretchable conductor, it is possible to form a conducting portion having a structure in which the conductive particles are aggregated in a high concentration at any interface position, such as a front surface, a rear surface, or an interface with fibers having a knitting structure, in accordance with the base material to be formed, and to use the conducting portion. In other words, it is preferable that the region which becomes the conducting portion by collecting the conductive particles in a high concentration is formed along a boundary part between the front surface and the rear surface or the base material, that is, along the interface of the mixture, in the mixture provided with the stretchable portion made of the elastomer and the plurality of conductive particles which are dispersed and blended into the stretchable portion.

In the stretchable conductor, the ink-like or paste-like mixture to be used may be used in a state of being coated and dried, but may be used in a state where the elastomers included in the mixture are crosslinked and stabilized.

In the present invention, since 10% or more of the second solvent which is represented by water does not dissolve in the first solvent in which the elastomers dissolve, it is observed that the second solvent forms the emulsion which is dispersed in a shape of a micelle (W/O shape). At this time, the micelles are aggregated on the interface by mixing the surfactant, and the conductive particles are aggregated on the interface in a high concentration. Since the water has high drying properties, there is a case where a quality control in a printing process is difficult. In this case, it is effective to use ethylene glycol having a high boiling point, or to use a solvent in which water and ethylene glycol are mixed in each other, as the second solvent. The ethylene glycol decreases surface tension of the second solvent, and practically functions similar to the surfactant. In addition, the solubility to the first solvent is similar to the water, and is appropriate as a composition of a paste for forming the stretchable conductor. Since the fibers have high affinity with water, it is possible to appropriately collect the second solvent on the interface with the paste for forming the stretchable conductor. By increasing the affinity of a gas-liquid interface or a solid-liquid interface with the second solvent in this manner, it is possible to selectively form the conducting portion on the interface.

EXAMPLE

Example 1

The ink-like mixture is obtained by using fluororubber (G801, name of a product made by Daikin Industries, Ltd.) as a raw material, by mixing the first solvent of 4-methyl-2-pentanone and the silver flakes having 10 μm or less of the average particle diameter in a mass proportion of 2:1:3, and by stirring and mixing the mixture for 12 hours by a magnetic stirrer. The paste-like mixture is obtained by mixing the fluorinated surfactant (Zonyl-FS300 (40% by mass), name of a product made by Du Pont Co., Ltd.) aqueous solution (second solvent) into the mixture, and by stirring and mixing the mixture for 12 hours by the magnetic stirrer.

Figure 6:
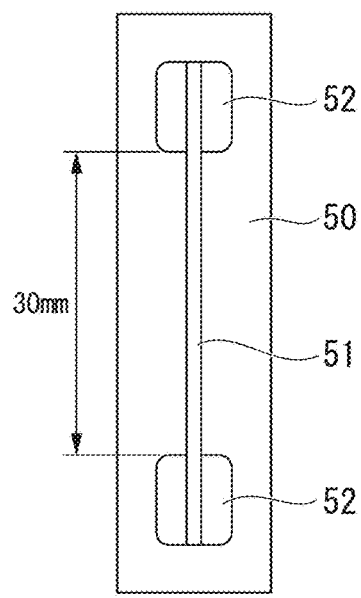
FIG. 6 is a view showing an example of a method of evaluating the stretchable conductor obtained in an example.

By using the paste-like mixture, a stretchable conductor 51 in which the length is 3 cm, the width is 500 μm, and the height is 20 μm to 30 μm is formed on a strip-like extendable resin film 50 shown in FIG. 6 by a stencil printing method. The extendable resin film 50 is provided with a rectangular scaffold pieces 52 and 52 made of polyimide on both end sides thereof, and configures a sample by forming both end portions of the stretchable conductor 51 to be in a shape of a bridge.

The extendable resin film uses the strip-like extendable resin film (210 kPa of Young's Modulus) made of PDMS (Sylgard 184 (name of a product made by Dow Corning Toray Co., Ltd.), a proportion of the main agent and a crosslinking agent is 20:1).

Example 2

In a case where the paste-like mixture is made, a plurality of stretchable conductors are made by changing a mixing proportion of the fluororubber and the fluorinated surfactant aqueous solution (second solvent), and a sample shown in FIG. 6 is made and evaluated by using each of the stretchable conductors.

Regarding each sample made, conductivity with respect to the strain is measured by a 4-terminal method while making the extending force act in the length direction of the strip-like stretchable resin film (speed: 3 mm/minute). A result thereof is shown in FIG. 7.

Figure 7:
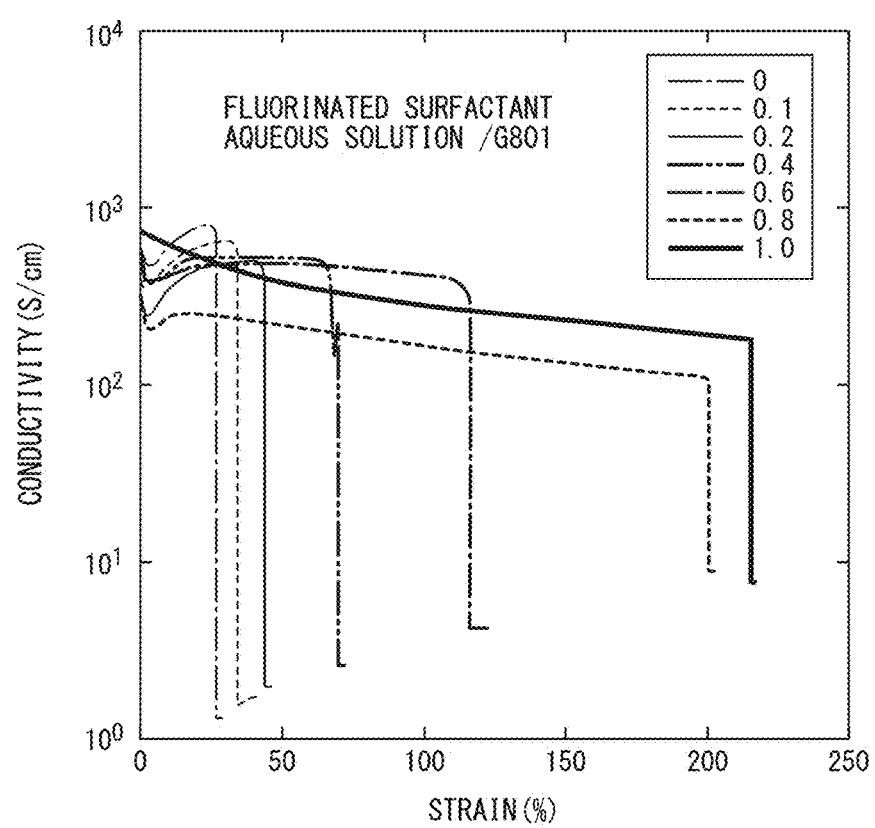
FIG. 7 is a view showing a correlation between a strain amount and resistance in each stretchable conductor sample obtained by changing a blending proportion of a fluorinated surfactant aqueous solution with respect to fluororubber in the example.

From the result shown in FIG. 7, it is ascertained that the extending properties are improved in accordance with the addition amount when increasing the amount of the fluorinated surfactant aqueous solution (concentration is 40% by mass: second solvent) added to the fluororubber. In particular, in order to obtain the conductivity which is 100 siemens or more even when the strain is 50% or more, it is determined that it is preferable to add the fluorinated surfactant aqueous solution (concentration is 40% by mass) which is 20% or more in a mass proportion into the fluororubber. In addition, when the fluorinated surfactant aqueous solution which is 80% to 100% in a mass proportion is added into the fluororubber, conductivity which exceeds 100 siemens is obtained even when the strain which is approximately 200% is applied.

Example 3

In a case where the paste-like mixture is made, by using any of G8001, G912, and LT-302 (all of these are the name of a product made by Daikin Industries, Ltd.) as the fluororubber to be used instead of the above-described G801, a sample of the stretchable conductor is made. Regarding each sample made, the conductivity with respect to the strain is measured by the 4-terminal method while making the extending force act in the length direction of the strip-like stretchable resin film (speed: 3 mm/minute). A result thereof is shown in FIG. 8.

Figure 8:
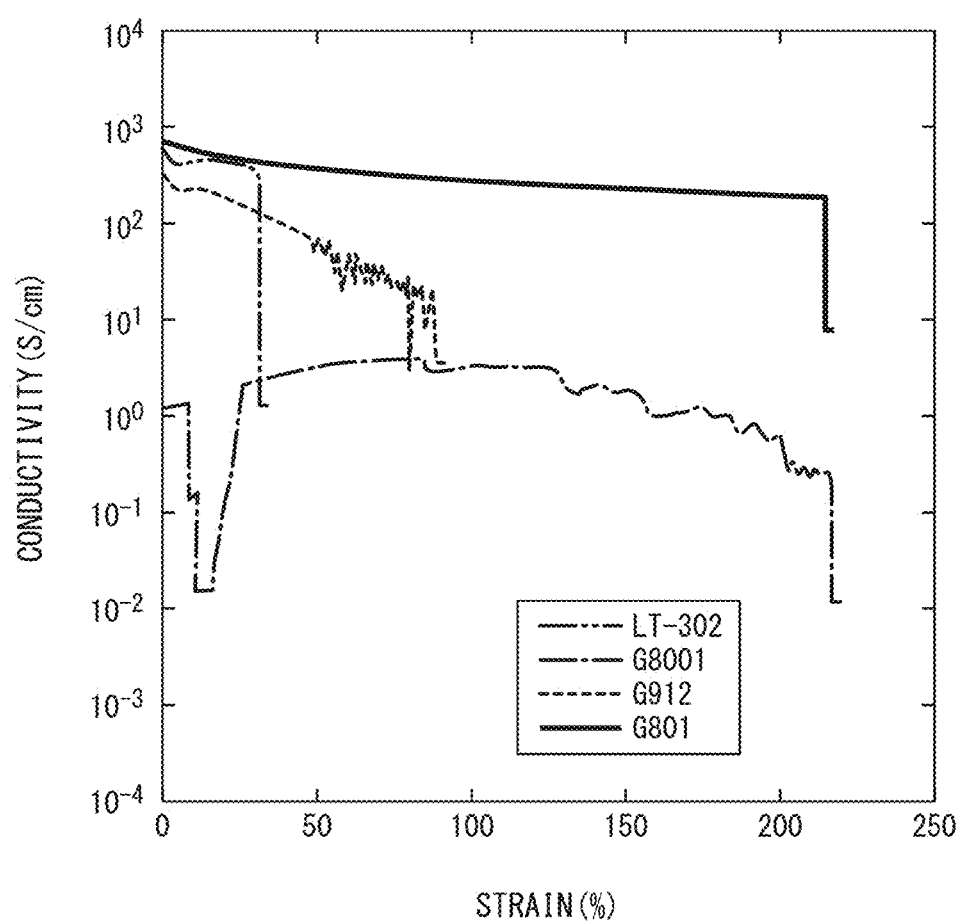
FIG. 8 is a view showing a correlation between the strain amount and the resistance in each stretchable conductor sample obtained by changing a type of fluororubber in the example.

From the result shown in FIG. 8, it is determined that G801 (name of a product made by Daikin Industries, Ltd.) shows the most excellent extending properties as the fluororubber to be used. In addition, even when the fluororubber is G912 (name of a product made by Daikin Industries, Ltd.) or the like, it is determined that the extending properties are improved.

Example 4

In a case where the ink-like mixture is made, a plurality of stretchable conductors are made by changing the concentration of the fluorinated surfactant aqueous solution to be used, a sample shown in FIG. 6 is made by using each of the stretchable conductors, and regarding each sample, conductivity with respect to the strain is measured by the 4-terminal method. In each stretchable conductor, the amount of the water and the fluorinated surfactant aqueous solution (Zonyl-FS300, name of a product made by Du Pont Co., Ltd.) is changed in a proportion of 15:2, 10:1, 5:2, 3:2, and 1:0, the blending proportion of the fluorinated surfactant aqueous solution and the fluororubber is 1:1, and G801 (name of a product made by Daikin Industries, Ltd.) is used as the fluororubber. The result of the measurement is shown in FIG. 9.

Figure 9:
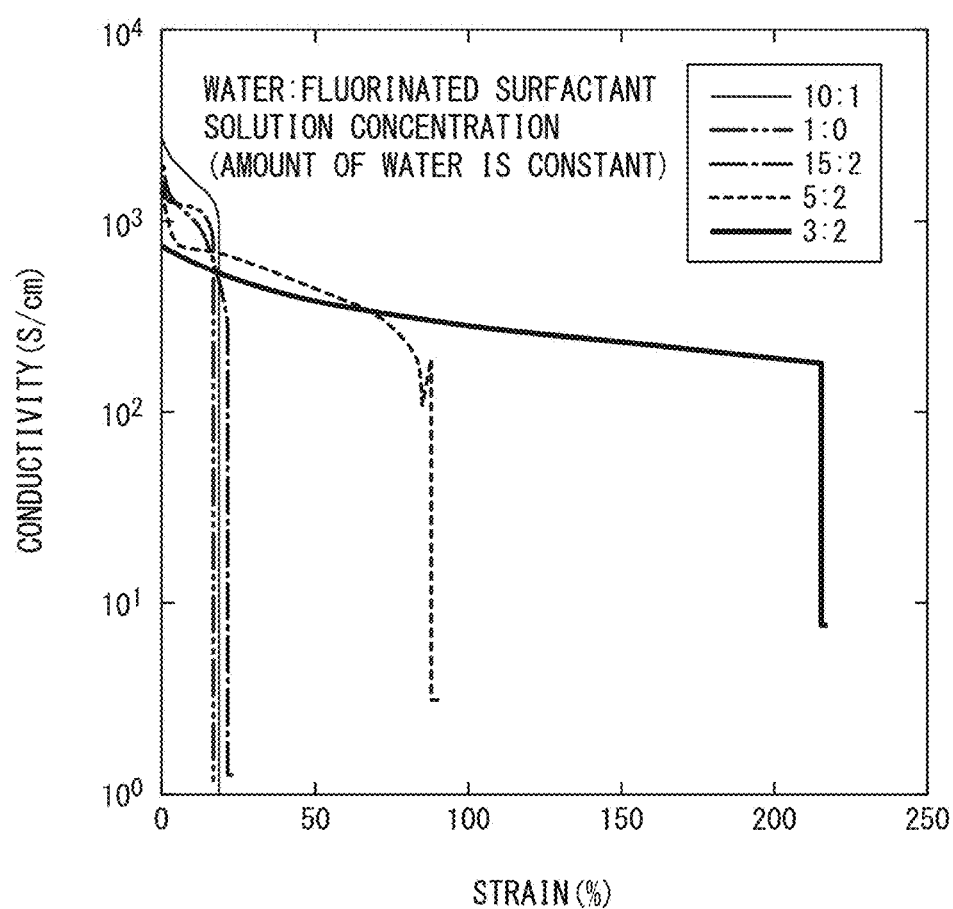
FIG. 9 is a view showing a correlation between the strain amount and the resistance in each stretchable conductor sample obtained by changing a concentration of the fluorinated surfactant aqueous solution in the example.

From the result shown in FIG. 9, the most excellent conductivity with respect to the strain is shown when the concentration of the fluorinated surfactant aqueous solution to be used is 3:2. In FIG. 9, the sample shown in a proportion of 1:0 shows a sample which is made only of the water and which does not include the fluorinated surfactant, but a conductivity which is excellent to a certain extent with respect to the strain even when the surfactant is not added in the sample, is shown.

In addition, since the stretchable conductor obtained by mixing only the fluorinated surfactant without the water does not show the conductivity, it is determined that it is important to use the fluorinated surfactant as an aqueous solution, and it is important to add the water as the second solvent which functions to phase-separate with respect to the first solvent when adding and reducing the water.

Example 5

In a case where the ink-like mixture is made, a plurality of stretchable conductors are made by changing the addition amount of the silver flakes to be used, the sample shown in FIG. 6 is made by using each of the stretchable conductors, and regarding each sample, the conductivity with respect to the strain is measured by the 4-terminal method. In each stretchable conductor, the blending proportion of the fluorinated surfactant aqueous solution (Zonyl-FS300 (concentration is 40% by mass), name of a product made by Du Pont Co., Ltd.) and the fluororubber is 1:1, and G801 is used as the fluororubber. The result of the measurement is shown in FIG. 10.

Figure 10:
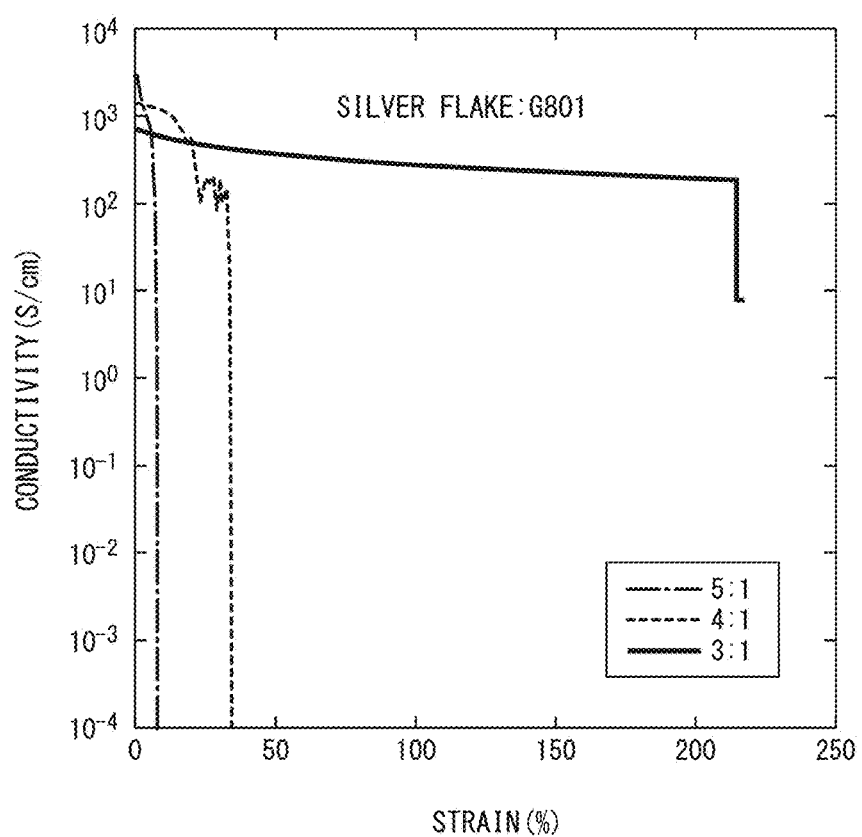
FIG. 10 is a view showing a correlation between the strain amount and the resistance in each stretchable conductor sample obtained by changing an addition amount of silver flakes in the example.

From the measurement result shown in FIG. 10, it is determined that the extending properties are not improved when the addition amount of the silver flakes is excessive. Form this, it is determined that the adjustment of the addition amount of the silver flakes is also important.

Example 6

Figure 11:
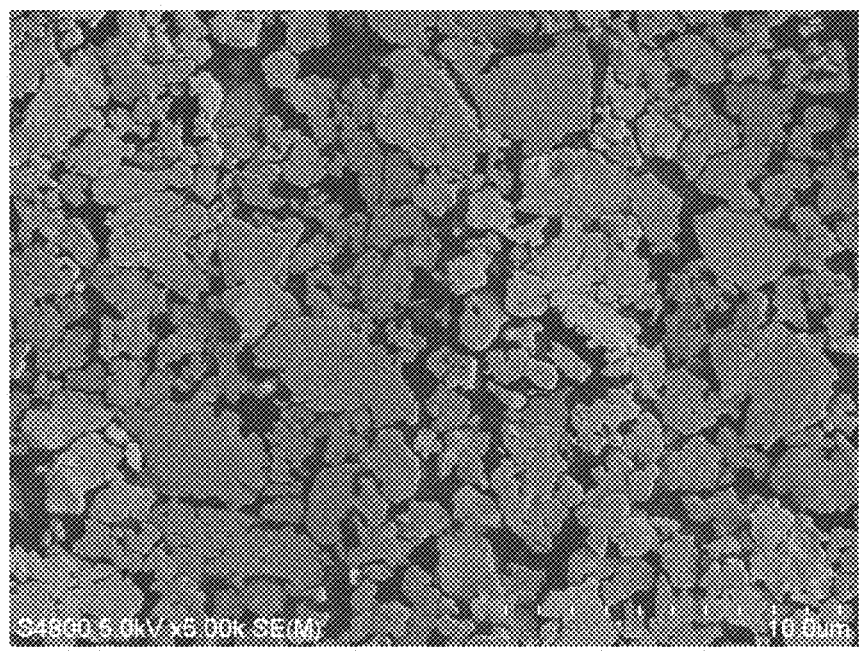
FIG. 11 is a photograph of a scanning electron microscope showing a state of a surface of the stretchable conductor sample obtained in the example.
Figure 12:
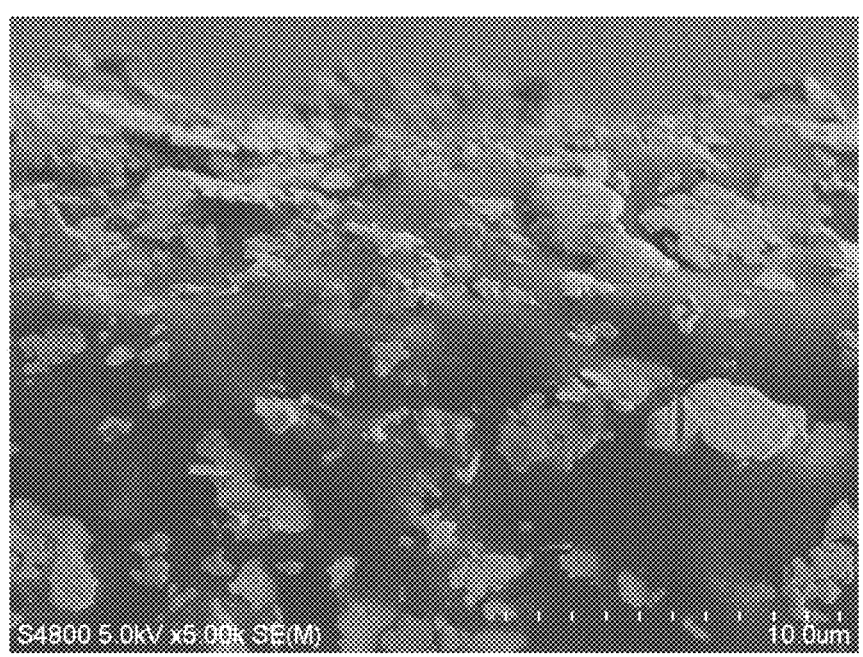
FIG. 12 is a photograph of the scanning electron microscope showing a sectional structure of the stretchable conductor sample obtained in the example.

Regarding the stretchable conductor obtained by mixing the fluororubber (G801, name of a product made by Daikin Industries, Ltd.), the first solvent (4-methyl-2-pentanone), the silver flakes (average particle diameter is 10 μm or less), and the surfactant aqueous solution which are used in Example 1 above in a mass proportion of 1:2:3:1, the results of photographing (5000 times) the surface by a scanning electron microscope and photographing (5000 times) the lateral section by the scanning electron microscope are shown in FIGS. 11 and 12.

A state of the surface shown in FIG. 11 shows a state where the scale-like silver flakes are aggregated on the surface of the stretchable conductor, and a part thereof is a partially porous body. Since the scale-like silver flakes are aggregated in a high concentration at a part of the front layer in this manner, in the stretchable conductor, it is possible to assume that the silver flakes aggregated in a high concentration at a part of the front layer ensure conductivity.

A lateral sectional structure shown in FIG. 12 shows that the silver flakes are slightly dispersed to a deep part on the inner side of the stretchable conductor, and the silver flakes are aggregated in a high concentration at a part of the front layer. It is possible to assume the phase-separation of the silver flakes is an effect due to blending the aqueous solution including the fluorinated surfactant. In addition, since the silver flakes which are aggregated in a high concentration are present at a part of the front layer of the stretchable conductor, even when extension is performed to receive the strain which is approximately 200%, it is possible to ensure a conductive bus between the silver flakes. Therefore, it is possible to assume that the extending properties are provided while maintaining excellent conductivity.

Example 7

Figure 13:
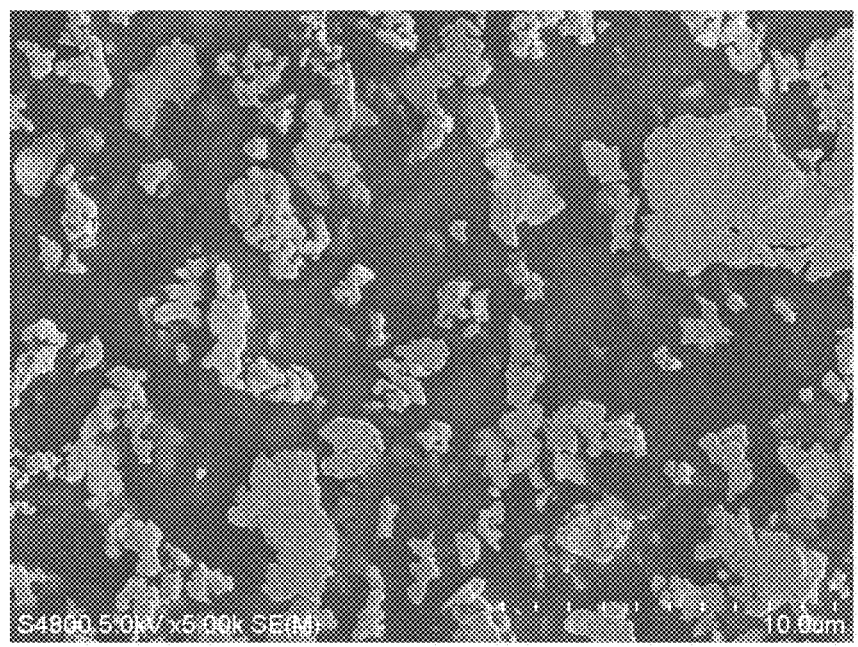
FIG. 13 is a photograph of the scanning electron microscope showing a state of a surface of a stretchable conductor sample obtained in a comparative example.
Figure 14:
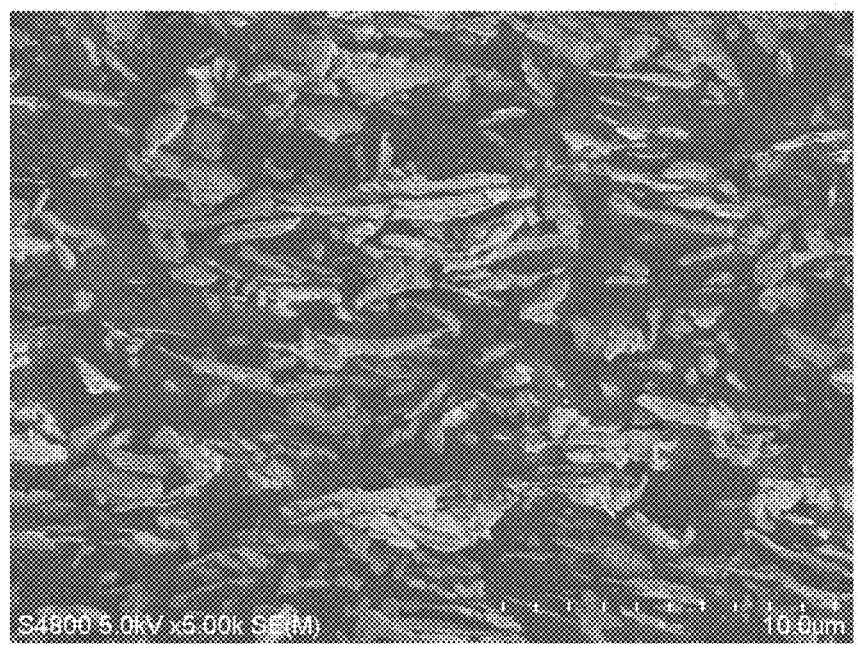
FIG. 14 is a photograph of the scanning electron microscope showing a sectional structure of the stretchable conductor sample obtained in the comparative example.

Regarding the stretchable conductor obtained by mixing the fluororubber (G801, name of a product made by Daikin Industries, Ltd.), the first solvent (4-methyl-2-pentanone), and the silver flakes (average particle diameter is 10 μm or less) which are used in Example 1 above in a proportion of 1:2:3, and by not blending the fluorinated surfactant aqueous solution, the results of photographing (5000 times) the surface by the scanning electron microscope and photographing (5000 times) a partial section by the scanning electron microscope are shown in FIGS. 13 and 14.

A state of the surface shown in FIG. 13 shows a state where the scale-like silver flakes are dispersed on the inside of the fluororubber. Since the fluororubber which serves as an insulation material is present between the adjacent silver flakes, it is difficult to obtain excellent conductivity by the silver flakes.

A lateral sectional structure shown in FIG. 14 shows that the silver flakes are randomly dispersed in the fluororubber, and the silver flakes are not aggregated in a high concentration at a part of the front layer. It is possible to assume that the dispersed state of the silver flakes is due to not blending the fluorinated surfactant aqueous solution.

A structure in which the periphery of the silver flakes shown in FIGS. 13 and 14 is divided by the fluororubber which is the insulation body, and the conductivity substantially deteriorates when the strain due to the extension acts, can be assumed.

Example 8

Figure 15:
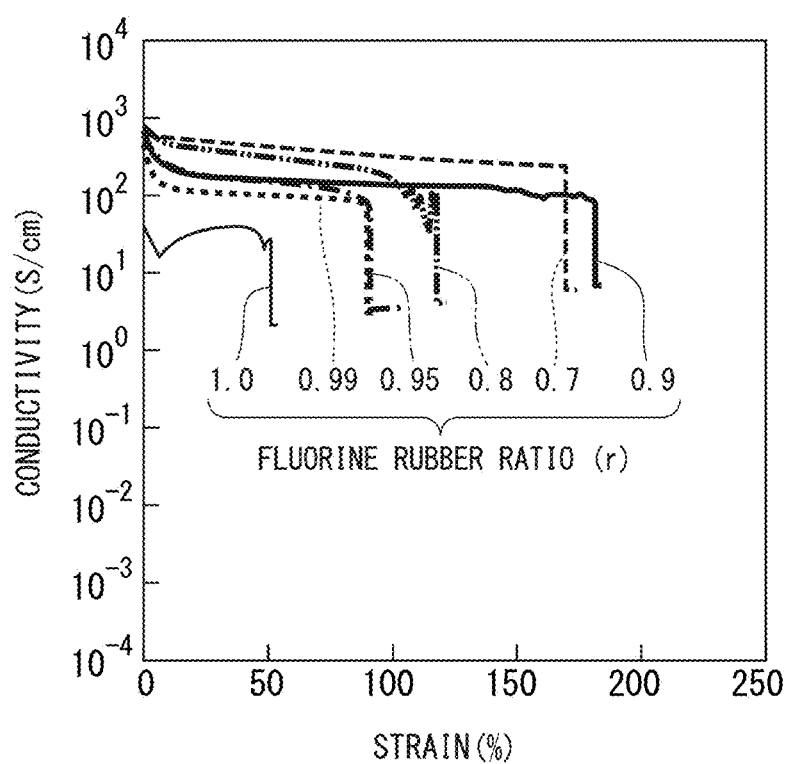
FIG. 15 is a view showing a correlation between the strain amount and the resistance in each stretchable conductor sample made in accordance with the amount of fluororesin in the example.

Regarding the stretchable conductor obtained from the paste mixture obtained by mixing the silver flakes (average particle diameter is 10 μm or less), fluororubber (G801, name of a product made by Daikin Industries, Ltd.), the surfactant, the first solvent (4-methyl-2-pentanone), and the second solvent (water) which are used in Example 1 above in a mass proportion of 3:6:4:12:6, the result of measuring the relationship between the strain and the resistance is shown in FIG. 15.

In addition, regarding the stretchable conductor obtained from the paste mixtures by making each paste mixture made by considering a total amount of the amount of the fluororubber and the surfactant 1, and by changing the mixing amount of the fluororubber to six types of total amount of 0.7, 0.8, 0.9, 0.95, 0.99, and 1.0 with respect to a total amount 1, the result of measuring of the relationship between the strain and the resistance is shown in FIG. 15.

From the result shown in FIG. 15, it is ascertained that the mixing amount of the fluororubber to the surfactant is effective within a range of 0.7 to 0.9 in order to obtain a strong stretchable conductor against the strain in a case where the mixing amount of the fluororubber and the surfactant changes. For example, in order to obtain the stretchable conductor which is resistant to 150% of strain, it is possible to obtain the stretchable conductor by making the mixing amount of the fluororubber to the surfactant to be 0.7 and 0.9, and in order to obtain the stretchable conductor which is resistant to 100% of strain, it is possible to obtain the stretchable conductor by making the mixing amount of the fluororubber to the surfactant to be 0.7-0.9.

In addition, from the result of FIG. 15, it is ascertained that the stretchable conductor in which a change in the resistance is small even when the strain is 50%, is obtained in the test example in which the surfactant is 0 and the second solvent made only of the water is used.

| Reference Signs List | |
|---|---|
| A | STRETCHABLE DEVICE, |
| 1 | STRETCHABLE RESIN FILM, |
| 2 | GATE WIRING (CONDUCTIVE CIRCUIT), |
| 3 | SOURCE WIRING (CONDUCTIVE CIRCUIT), |
| 5 | SEMICONDUCTOR LOADING BASE DEVICE, |
| 6 | DRAIN WIRING (CONDUCTIVE CIRCUIT), |
| 7 | RESIN SUBSTRATE, |
| 8 | GATE ELECTRODE, |
| 9 | OXIDE FILM, |
| 10 | MODIFYING FILM, |
| 11 | ORGANIC SEMICONDUCTOR LAYER, |
| 12 | SOURCE ELECTRODE, |
| 13 | DRAIN ELECTRODE, |
| 15 | INNER SEALING LAYER, |
| 20 | INNER COATING LAYER, |
| 31 | FIRST SEALING LAYER, |
| 32 | SECOND SEALING LAYER, |
| 35 | PROTECTIVE LAYER, |
| 40 | STRETCHABLE CONDUCTOR, |
| 41 | STRETCHABLE PORTION, |
| 42 | CONDUCTIVE PARTICLE, |
| 43 | CONDUCTING PORTION |

What is claimed is:

1. A stretchable conductor, comprising:
a stretchable portion; and
a conducting portion;
wherein:
the stretchable portion is made of an elastomer, a plurality of conductive particles being dispersed within the elastomer;
the conducting portion is made of an elastomer, a plurality of conductive particles being dispersed within the elastomer in a higher concentration than that of the stretchable portion;
the conducting portion is formed at one or a plurality of positions on an interface of the elastomer;
the plurality of conductive particles are arranged so as to overlap each other, and dispersed within the elastomer in the conducting portion; and
the conducting portion maintains the conductivity greater than 100 siemens when an extension of 50% to 200% of strain is applied.

2. The stretchable conductor according to claim 1, wherein a content of the conductive particles is 400% or less with respect to the mass of the elastomer.

3. The stretchable conductor according to claim 1, wherein the conductive particles are metal thin piece fine particles of which the particle diameter is 1 μm to 5 μm.

4. The stretchable conductor according to claim 1, wherein the elastomer is crosslinked.

5. The stretchable conductor according to claim 1, wherein the elastomer is a fluororubber.

* * * * *